(12) United States Patent
Chen et al.

(10) Patent No.: US 12,142,451 B2
(45) Date of Patent: Nov. 12, 2024

(54) SYSTEM FOR INSPECTING AND GROUNDING A MASK IN A CHARGED PARTICLE SYSTEM

(71) Applicant: ASML NETHERLANDS B.V., Veldhoven (NL)

(72) Inventors: Tianming Chen, San Jose, CA (US); Chiyan Kuan, Danville, CA (US); Yixiang Wang, Fremont, CA (US); Zhi Po Wang, Beijing (CN)

(73) Assignee: ASML Netherlands B.V., Veldhoven (NL)

( * ) Notice: Subject to any disclaimer, the term of this patent is extended or adjusted under 35 U.S.C. 154(b) by 259 days.

(21) Appl. No.: 17/778,579

(22) PCT Filed: Oct. 21, 2020

(86) PCT No.: PCT/EP2020/079674
§ 371 (c)(1),
(2) Date: May 20, 2022

(87) PCT Pub. No.: WO2021/083773
PCT Pub. Date: May 6, 2021

(65) Prior Publication Data
US 2023/0005698 A1 Jan. 5, 2023

Related U.S. Application Data

(60) Provisional application No. 62/926,973, filed on Oct. 28, 2019.

(51) Int. Cl.
*H01J 37/02* (2006.01)
*G03F 7/00* (2006.01)
*H01J 37/28* (2006.01)

(52) U.S. Cl.
CPC ............ *H01J 37/026* (2013.01); *G03F 7/708* (2013.01); *H01J 37/28* (2013.01); *H01J 2237/0044* (2013.01)

(58) Field of Classification Search
CPC .. H01J 37/026; H01J 37/28; H01J 2237/0044; H01J 2237/004; H01J 2237/2817; H01J 37/20; G03F 7/708
(Continued)

(56) References Cited

U.S. PATENT DOCUMENTS 6,600,162 B1 * 7/2003 Hahmann ............ B82Y 40/00
250/397
8,575,573 B2 11/2013 Wang et al.
(Continued)

FOREIGN PATENT DOCUMENTS

CN 109154680 A 1/2019
EP 1363395 A1 11/2003
(Continued)

OTHER PUBLICATIONS

Office Action issued by the Intellectual Property Office (IPO) in related ROC (Taiwan) Patent Application No. 109137184, mailed Sep. 23, 2021 (10 pgs.).
(Continued)

*Primary Examiner* — Dharti H Patel
(74) *Attorney, Agent, or Firm* — Finnegan, Henderson, Farabow, Garrett & Dunner, LLP

(57) ABSTRACT

A system for grounding a mask using a grounding component are provided. Some embodiments of the system include a grounding component comprising a base and an extension protruding from the base and comprising a conductive prong configured to contact a conductive layer of the mask. Some embodiments of the system include a plurality of conductive prongs configured to contact multiple positions of a con-
(Continued)

ductive layer of the mask. Some other embodiments of the system include an extension comprising various shapes.

22 Claims, 10 Drawing Sheets

(58) Field of Classification Search
USPC .......................................................... 361/220
See application file for complete search history.

(56) References Cited

U.S. PATENT DOCUMENTS

| | | | |
|---|---|---|---|
| 9,859,089 B2 | 1/2018 | Weng et al. | |
| 10,054,556 B2 | 8/2018 | Wang et al. | |
| 10,775,325 B2* | 9/2020 | Weng | H01J 37/026 |
| 2006/0292457 A1* | 12/2006 | Meijer | B82Y 40/00 |
| | | | 355/75 |
| 2012/0292509 A1* | 11/2012 | Wang | H01J 37/026 |
| | | | 361/222 |
| 2014/0027634 A1* | 1/2014 | Wang | H01J 37/026 |
| | | | 250/310 |
| 2014/0268612 A1* | 9/2014 | Zhang | H01L 23/49822 |
| | | | 257/532 |
| 2015/0102220 A1* | 4/2015 | Weng | H05F 3/02 |
| | | | 250/307 |
| 2015/0325402 A1* | 11/2015 | Weng | H01J 37/026 |
| | | | 250/440.11 |
| 2017/0053774 A1* | 2/2017 | Wang | G01N 23/2251 |
| 2018/0068824 A1 | 3/2018 | Kawaguchi et al. | |
| 2021/0172891 A1* | 6/2021 | Weng | H01J 37/026 |

FOREIGN PATENT DOCUMENTS

| | | |
|---|---|---|
| JP | 2007013149 A | 1/2007 |
| TW | 201248312 A | 12/2012 |
| TW | 201317718 A | 5/2013 |
| TW | 201443553 A | 11/2014 |
| WO | WO 2019/037672 A1 | 2/2019 |

OTHER PUBLICATIONS

International Search Report and Written Opinion received from the International Search Authority issued in related International Application No. PCT/EP2020/079674 mailed Dec. 9, 2020 (11 pgs.).

* cited by examiner

SYSTEM FOR INSPECTING AND GROUNDING A MASK IN A CHARGED PARTICLE SYSTEM

CROSS-REFERENCE TO RELATED APPLICATIONS

This application claims priority to International Application No. PCT/EP2020/079674, filed Oct. 21, 2020, and published as WO 2021/083773 A1, which claims priority of U.S. application No. 62/926,973 which was filed on Oct. 28, 2019. The contents of these applications are incorporated herein by reference in their entireties.

TECHNICAL FIELD

The present disclosure generally relates to the field of inspecting a mask using a charged particle beam system and grounding a mask while the mask is inspected using the charged particle beam system.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed.

Optical inspection of a mask is based on a comparison of the light signals in patterned regions of the mask to the light signals in non-patterned regions of the mask. A high contrast in the comparison may be needed to obtain sufficient sensitivity for defect detection in the mask. The transmissive masks used in deep ultraviolet (DUV) lithography may be inspected with little difficulty since there is high contrast at UV/DUV wavelengths between the opaque regions and the transparent regions on the mask. But there is more difficulty in inspecting reflective masks (e.g., extreme ultraviolet masks) used in extreme ultraviolet (EUV) lithography since there is a lower contrast at UV/DUV wavelengths between the absorber regions and the mirror regions on the mask and because the wavelengths of the UV/DUV are too long to inspect reflective masks.

A charged particle (e.g., electron) beam microscope, such as a scanning electron microscope (SEM) or a transmission electron microscope (TEM), capable of resolution down to less than a nanometer, serves as a practicable tool for inspecting reflective masks. With a SEM, electrons of a single primary electron beam, or electrons of a plurality of primary electron beams, can be focused at locations of interest of a mask under inspection. The primary electrons interact with the mask and may be backscattered or may cause the mask to emit secondary electrons. The intensity of the electron beams comprising the backscattered electrons and the secondary electrons may vary based on the properties of the internal and external structures of the mask, and thereby may indicate whether the mask has defects.

SUMMARY

Embodiments consistent with the present disclosure include systems for grounding a mask in a charged particle system. The system includes a grounding component. The grounding component comprises a base and an extension protruding from the base. The extension comprises a conductive prong configured to contact a conductive layer of the mask.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DETAILED DESCRIPTION

Figure 1:
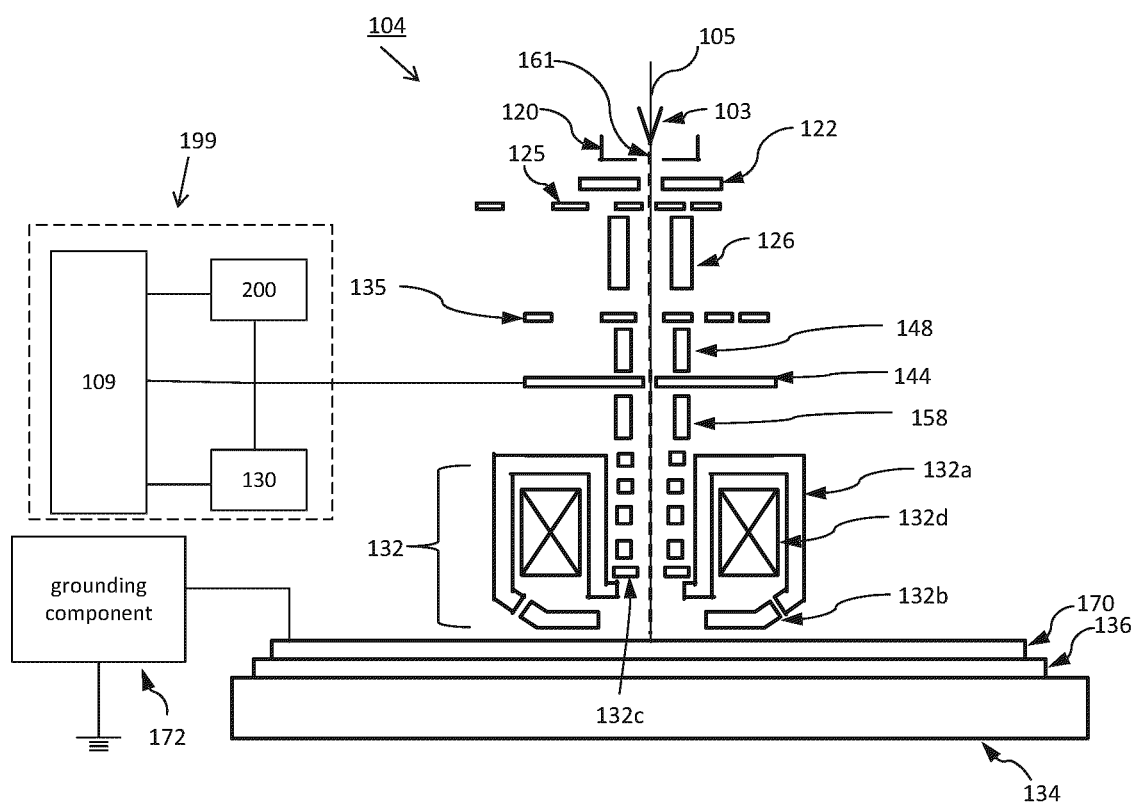
FIG. 1 is a schematic diagram illustrating an exemplary electron beam tool, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

Defects may be generated during various stages of semiconductor processing. For the reason stated above, it is important to find defects accurately and efficiently as early as possible. A charged particle (e.g., electron) beam microscope, such as a scanning electron microscope (SEM), is a useful tool for inspecting a mask (e.g., EUV mask, DUV mask, etc.) surfaces to detect defects. During operation, the charged particle beam microscope scans a primary charged-particle beam, such as an electron beam (e-beam), over a mask on a holder, and generates an image of the mask surface by detecting a secondary charged-particle beam reflected from the mask surface. Inspection of the mask may be employed by comparing light signals in patterned regions of the mask to light signals in non-patterned regions of the mask. A high contrast between the light signals of the different mask regions may result in sufficient sensitivity for defect detection.

When the charged-particle beam scans the mask, charges may be accumulated on the mask due to large beam current, which may affect the quality of the image. For example, if charges accumulate on the surface of a mask during inspection, then the contrast and intensity of the scanned images at different areas of the mask may be inconsistent. To regulate the accumulated charges on the mask, the mask may be grounded so as to control the accumulated charges. It is thus important to improve the grounding mechanism so as to effectively control the accumulated charges.

Some masks, however, suffer from design constraints. For example, a mask may not be easily grounded because the substrate and an upper layer of the mask are dielectric. The upper dielectric layer of the mask may have openings where a conductive layer of the mask is exposed. Because the conductive layer of the mask may be beneath an upper dielectric layer, a planar grounding component may not contact the conductive layer of the mask. This reduced contact between the planar grounding component and the conductive layer of the mask results in charge accumulation on the mask, which results in reduced inspection quality of the mask. Because of the upper dielectric layer above the conductive layer of the mask, a grounding component may have a conductive prong that may contact the conductive layer exposed by the upper dielectric layer.

The disclosed embodiments provide an e-beam system that includes a grounding component that addresses some or all of these disadvantages. The disclosed embodiments provide an e-beam system having a grounding component that may sufficiently contact a mask so that charge accumulation on the mask may be reduced, thereby allowing for a better image of the mask.

FIG. 1 illustrates a charged particle beam apparatus in which an electron beam system may comprise a single primary beam that may be configured to generate a secondary beam. A detector may be placed along an optical axis 105, as shown in FIG. 1. In some embodiments, a detector may be arranged off axis.

As shown in FIG. 1, an electron beam tool 104 may include a holder 136 supported by motorized stage 134 to hold a mask 170 to be inspected. Electron beam tool 100 may be a single-beam system or a multi-beam system. Electron beam tool 104 includes an electron beam source, which may comprise a cathode 103, an anode 120, and a gun aperture 122. Electron beam tool 104 further includes a beam limit aperture 125, a condenser lens 126, a column aperture 135, an objective lens assembly 132, and an electron detector 144. Objective lens assembly 132, in some embodiments, may be a modified swing objective retarding immersion lens (SORIL), which includes a pole piece 132a, a control electrode 132b, a deflector 132c, and an exciting coil 132d. In an imaging process, an electron beam 161 emanating from the tip of cathode 103 may be accelerated by anode 120 voltage, pass through gun aperture 122, beam limit aperture 125, condenser lens 126, and focused into a probe spot by the modified SORIL lens and then impinge onto the surface of mask 170. The probe spot may be scanned across the surface of mask 170 by a deflector, such as deflector 132c or other deflectors in the SORIL lens. Mask 170 may be grounded by grounding component 172 during scanning Grounding component 172 may ground mask 170 by contacting conductive areas of mask 170. Secondary electrons emanated from the mask may be collected by detector 144 to form an image of an area of interest on mask 170.

There may also be provided an image processing system 199 that includes an image acquirer 200, a storage 130, and a controller 109. Image acquirer 200 may comprise one or more processors. For example, image acquirer 200 may comprise a computer, server, mainframe host, terminals, personal computer, any kind of mobile computing devices, and the like, or a combination thereof. Image acquirer 200 may connect with detector 144 of electron beam tool 104 through a medium such as an electrical conductor, optical fiber cable, portable storage media, IR, Bluetooth, internet, wireless network, wireless radio, or a combination thereof. Image acquirer 200 may receive a signal from detector 144 and may construct an image. Image acquirer 200 may thus acquire images of mask 170. Image acquirer 200 may also perform various post-processing functions, such as generating contours, superimposing indicators on an acquired image, and the like. Image acquirer 200 may be configured to perform adjustments of brightness and contrast, etc. of acquired images. Storage 130 may be a storage medium such as a hard disk, random access memory (RAM), cloud storage, other types of computer readable memory, and the like. Storage 130 may be coupled with image acquirer 200 and may be used for saving scanned raw image data as original images, and post-processed images. Image acquirer 200 and storage 130 may be connected to controller 109. Controller 109 may be electronically connected to electron beam tool 104. Controller 109 may be a computer configured to execute various controls of electron beam tool 104. In some embodiments, image acquirer 200, storage 130, and controller 109 may be integrated together as one control unit.

In some embodiments, image acquirer 200 may acquire one or more images of a mask based on an imaging signal received from detector 144. An imaging signal may correspond to a scanning operation for conducting charged particle imaging. An acquired image may be a single image comprising a plurality of imaging areas that may contain various features of mask 170. The single image may be stored in storage 130. Imaging may be performed on the basis of imaging frames.

The condenser and illumination optics of the electron beam tool may comprise or be supplemented by electromagnetic quadrupole electron lenses. For example, as shown in FIG. 1, the electron beam tool 104 may comprise a first quadrupole lens 148 and a second quadrupole lens 158. In some embodiments, the quadrupole lenses are used for controlling the electron beam. For example, first quadrupole lens 148 can be controlled to adjust the beam current and second quadrupole lens 158 can be controlled to adjust the beam spot size and beam shape. It is to be appreciated that any number of poles and any number of lenses may be used, as appropriate.

Although FIG. 1 shows electron beam tool 104 as a single-beam inspection tool that may use only one primary electron beam to scan one location of mask 170 at a time, embodiments of the present disclosure are not so limited. For example, electron beam tool 104 may also be a multi-beam inspection tool that employs multiple primary electron beamlets to simultaneously scan multiple locations on mask 170.

Figure 2A:
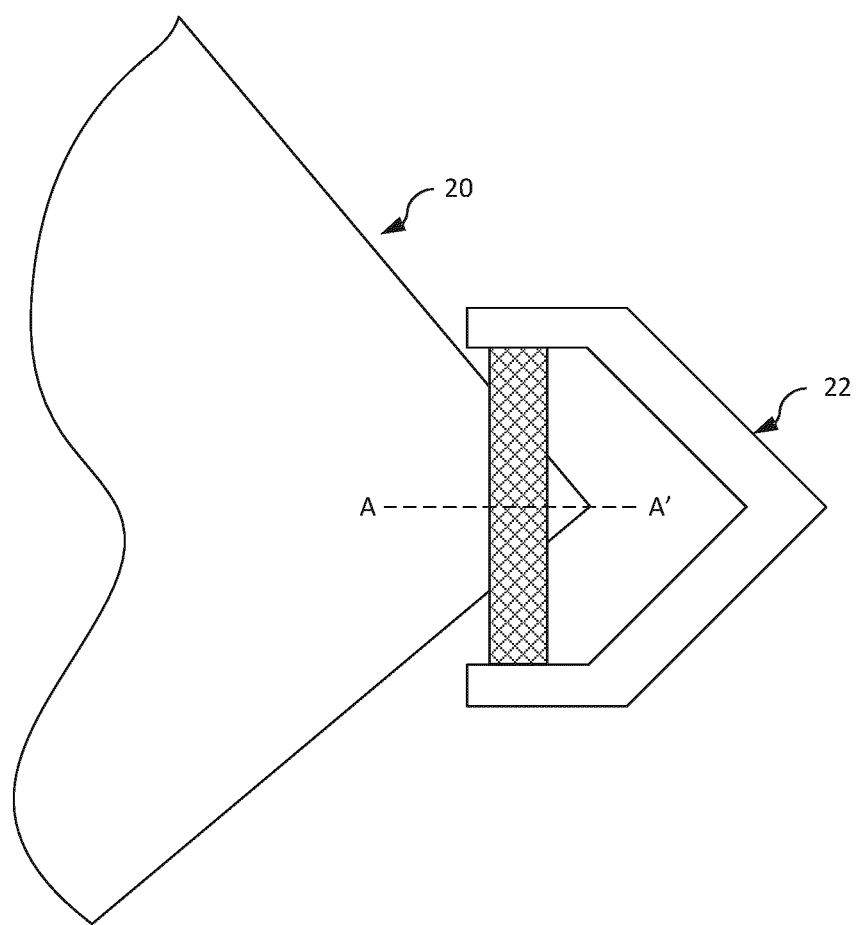
FIG. 2A is a top view of a mask with a conventional configuration of a grounding component.

FIG. 2A illustrates a top view of a mask with a conventional configuration of a grounding component. As shown in FIG. 2A, a grounding component 22 may be used to ground a mask 20. Grounding component 22 may be planar, which may be sufficient to reduce charge accumulation for some masks, but not all masks. For example, if the uppermost layer of mask 20 is conductive, then grounding component 22 may sufficiently ground mask 20 to regulate the accumulated charges on mask 20. If the uppermost layer of mask 20 is dielectric, however, then planar grounding component 22 may not contact a conductive layer of mask 20 (e.g., see FIG. 2B). In this case, grounding component 22 may not sufficiently ground mask 20.

Figure 2B:
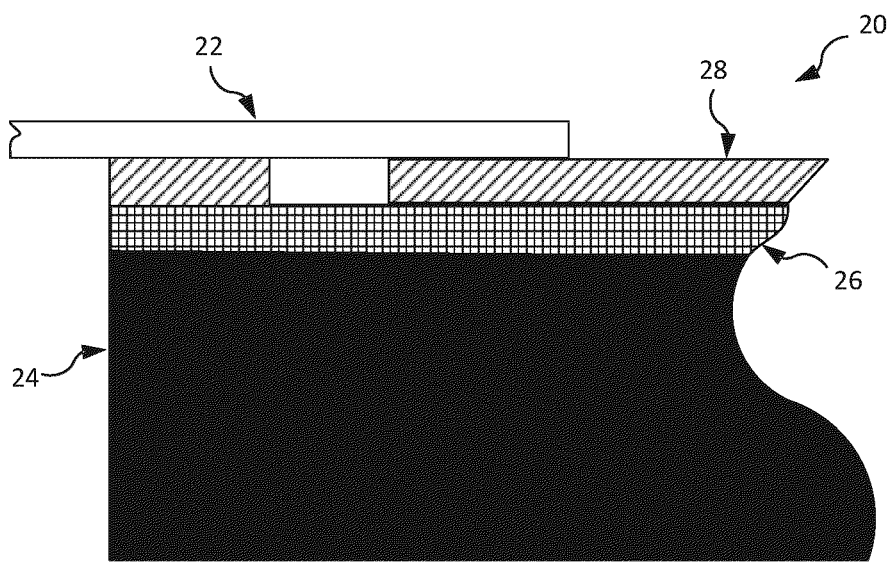
FIG. 2B is a cross-sectional view of a mask with a conventional configuration of a grounding component along A-A' of FIG. 2A.

FIG. 2B illustrates a cross-sectional view of a mask 20 and grounding component 22 of FIG. 2A along A-A'. As shown in FIG. 2B, mask 20 may comprise a substrate 24, a conductive layer 26 on substrate 24, and a dielectric layer 28 on conductive layer 26. For this type of mask, grounding component 22 may not contact conductive layer 26, resulting in charges accumulating on mask 20 due to the lack of grounding. As stated above, the accumulation of charges on the mask can cause corresponding images of the mask to be distorted.

Figure 3:
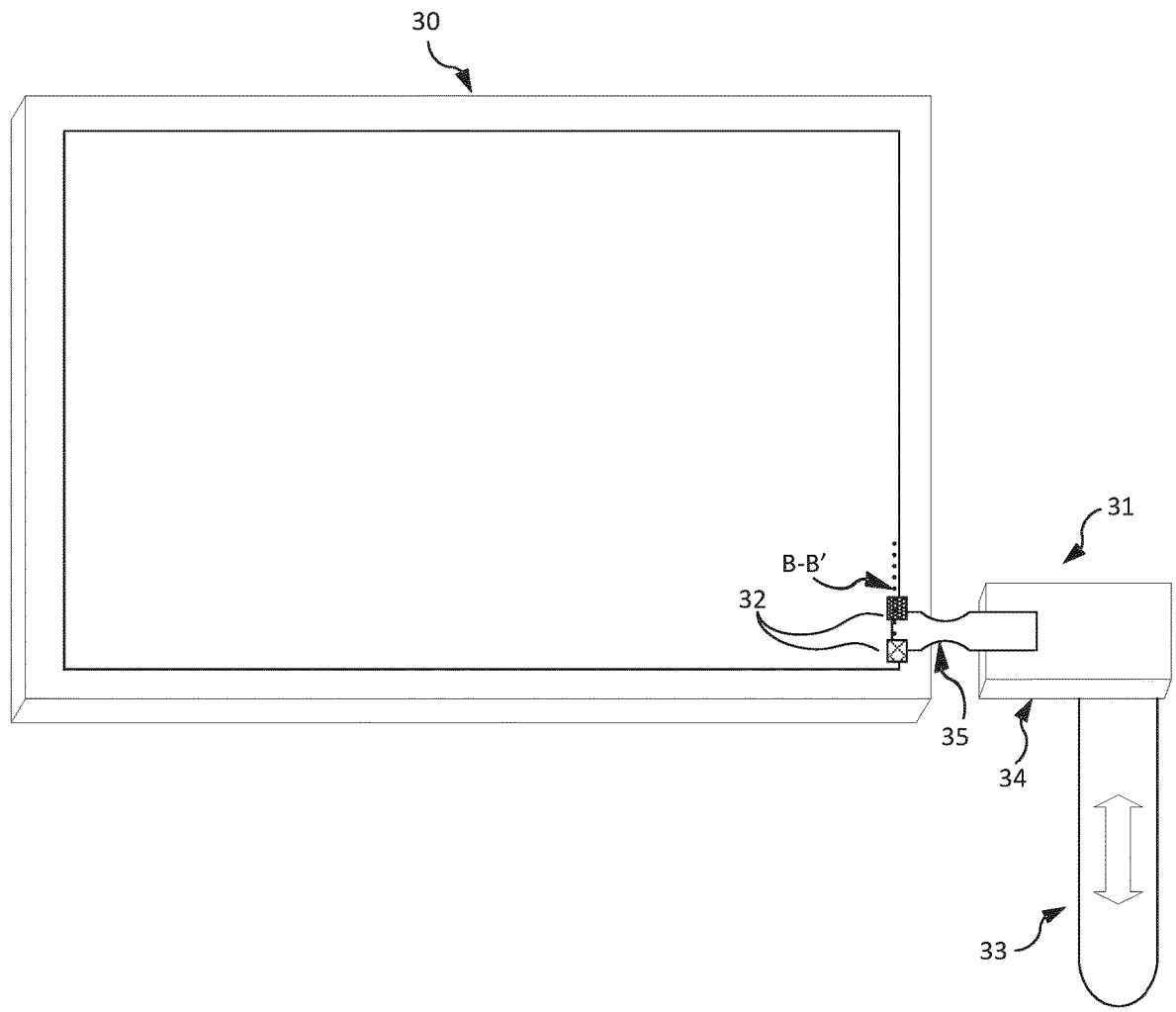
FIG. 3 is a perspective view of an exemplary mask with a grounding component, consistent with embodiments of the present disclosure.

FIG. 3 illustrates a perspective view of an exemplary mask with a grounding component, consistent with embodiments of the present disclosure. As shown in FIG. 3, a grounding component 31 may be used to ground a mask 30. Grounding component 31 may comprise a length-adjustable handle 33 and a base 34 attached to handle 33. Grounding component 31 may also comprise an extension 35 that may either be conductive or non-conductive and protrudes from base 34. Extension 35 may comprise two prongs 32 that may be conductive and may contact mask 30. In some embodiments, extension 35 may comprise only one prong. Prong 32 may comprise a plurality of individual prongs (see, e.g., prong 52 of FIG. 5, prong 62 of FIG. 6, prongs 72 of FIG. 7, prongs 82 of FIG. 8, prongs 92 of FIG. 9) so that grounding component 31 may contact mask 30 at one or more positions to ensure that mask 30 is sufficiently grounded. Each individual prong may comprise various conductive and flexible materials. In some embodiments, extension 35 and all but the tip portion of prong 32 may be non-conductive such that a wire (not shown) may be used to ground mask 30 at each conductive tip portion of prong 32. In some embodiments, a voltage may be applied (e.g., 6V) via grounding component 31 to establish conduction with mask 30.

When mask 30 is scanned by a charged-particle tool (e.g., electron beam tool 104 of FIG. 1) without grounding component 31 during inspection, mask 30 may retain more positive or negative charges, thereby resulting in a positive or negative potential (i.e., accumulated charges) at the surface of mask 30. In contrast, when mask 30 is grounded (i.e., when a conductive portion of mask 30 is contacted) by grounding component 31 during inspection, mask 30 may retain less positive or negative charges due to neutralization of the accumulated charges by the electrons supplied by grounding component 31. Grounding mask 30 during inspection may result in mask 30 emitting an amount of secondary electrons that is consistent across mask 30, thereby resulting in an image processing system (e.g., image processing system 199 of FIG. 1) generating more consistent images during inspection.

Figure 4:
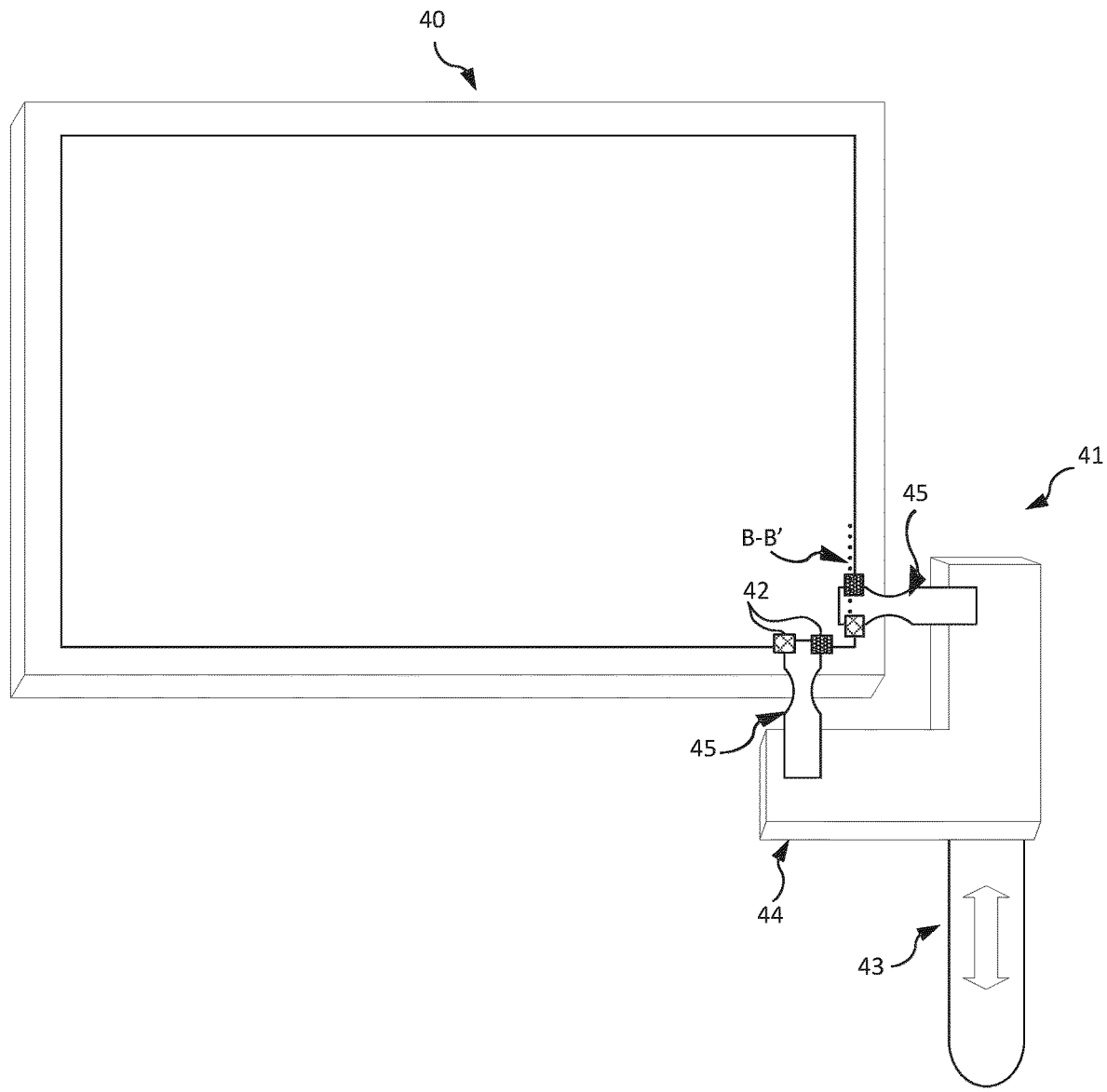
FIG. 4 is a perspective view of an exemplary mask with a grounding component, consistent with embodiments of the present disclosure.

FIG. 4 illustrates a perspective view of another exemplary mask with a grounding component, consistent with embodiments of the present disclosure. The components of FIG. 4 are similar to those of FIG. 3, except that FIG. 4 provides a grounding component 41 that may have two extensions 45.

As shown in FIG. 4, grounding component 41 may be used to ground a mask 40. Grounding component 41 may comprise a length-adjustable handle 43 and a base 44 attached to handle 43. As stated above, grounding component 41 may have two extensions 45 that protrude from base 44. Extensions 45 may each comprise two prongs 42 that may be conductive and may contact mask 40. In some embodiments, extensions 45 may comprise only one prong. Prong 42 may comprise a plurality of individual prongs (see, e.g., prong 52 of FIG. 5, prong 62 of FIG. 6, prongs 72 of FIG. 7, prongs 82 of FIG. 8, prongs 92 of FIG. 9) so that grounding component 41 may contact mask 40 at one or more positions to ensure that mask 40 is sufficiently grounded. Each individual prong may comprise various conductive and flexible materials. In some embodiments, a voltage may be applied (e.g., 6V) via grounding component 41 to establish conduction with mask 40 or to verify that an electrical connection has been established with mask 40.

Figure 5:
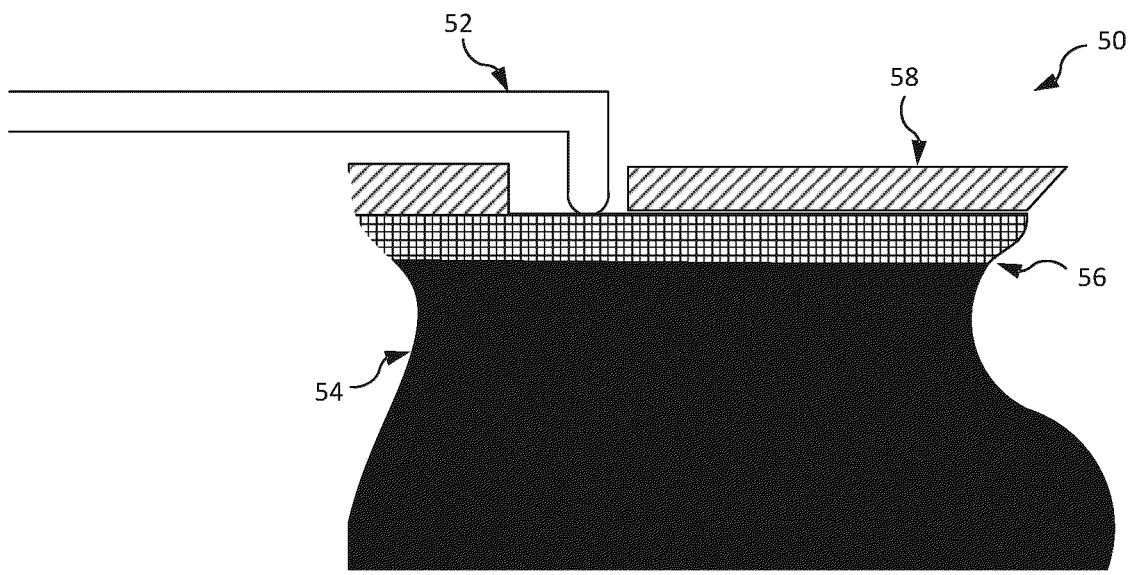
FIG. 5 is a cross-sectional view along B-B' of an exemplary mask with a grounding component (see, e.g., FIG. 3 or FIG. 4), consistent with embodiments of the present disclosure.

FIG. 5 illustrates a cross-sectional view along B-B' of an exemplary mask with a grounding component (see, e.g., the cross-sectional line B-B' of FIG. 3 or FIG. 4), consistent with embodiments of the present disclosure. As shown in FIG. 5, a mask 50 may comprise a substrate 54, a conductive layer 56 on substrate 54, and a dielectric layer 58 on conductive layer 56. Conductive layer 56 may be exposed by a space (e.g., trench) in dielectric layer 58. As explained above for FIG. 2B, a planar grounding component may not contact conductive layer 56, resulting in accumulated charges on mask 50 due to lack of grounding.

To simplify illustration, prong 52 is shown in FIG. 5 as running perpendicular to the trench in dielectric layer 58, while, in FIG. 4, prong 52 runs parallel to this trench. Because the shape and size (e.g., depth, width, etc.) of the space within dielectric layer 58 may be small (e.g., 0.1-2.0 mm or smaller), an individual prong 52, which may be conductive, may need to have a certain elastic deformation for flexibility in grounding mask 50. As depicted, prong 52 may have a bend at its end to facilitate prong 52 making contact with conductive layer 56. In some embodiments, individual prong 52 may have a substantially flat "finger" shape that extends into the space within dielectric layer 58, although it is not limited to that shape. A finger shape may be useful to facilitate contact between prong 52 and conductive layer 56 when, for example, the finger runs parallel to a slot in dielectric layer 58. The shape and size of the space within dielectric layer 58 may also vary for different types of masks.

Figure 6:
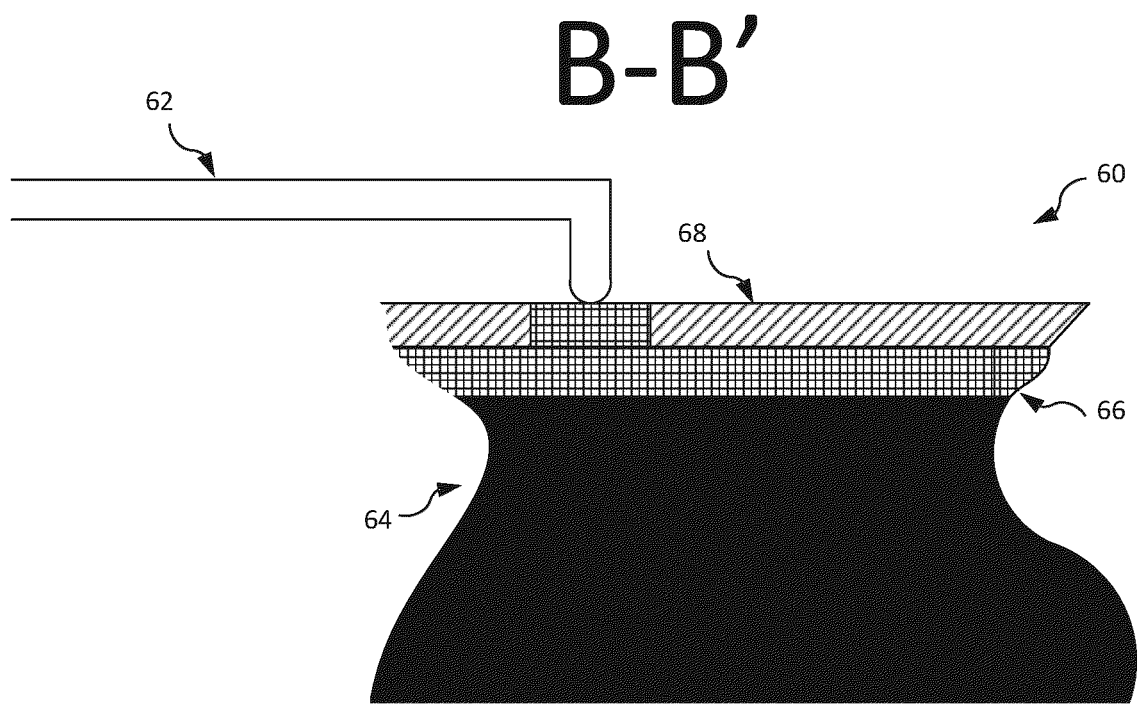
FIG. 6 is a cross-sectional view along B-B' of an exemplary mask with a grounding component (see, e.g., FIG. 3 or FIG. 4), consistent with embodiments of the present disclosure.

FIG. 6 illustrates another cross-sectional view along B-B' of an exemplary mask with a grounding component (see, e.g., the cross-sectional line B-B' of FIG. 3 or FIG. 4), consistent with embodiments of the present disclosure. The components of FIG. 6 are similar to those of FIG. 5, except that FIG. 6 provides a mask 60 with filled space within a dielectric layer 68.

As shown in FIG. 6, mask 60 may comprise a substrate 64, a conductive layer 66 on substrate 64, and dielectric layer 68 on conductive layer 66. Conductive layer 66 may fill a space within dielectric layer 68 so that it is coplanar with dielectric layer 68. In some embodiments, the space within dielectric layer 68 may be partially filled by conductive layer 66, or conductive layer 66 may extend to above dielectric layer 68 so that conductive layer 66 is not coplanar with dielectric layer 68. To simplify illustration, prong 52 is shown in FIG. 6 as running perpendicular to the filled trench in dielectric layer 68, while, in FIG. 4, prong 52 runs parallel to this trench. In some embodiments, multiple individual prongs 62 may be conductive and may be used to contact conductive layer 66 at different positions of mask 60 to sufficiently ground mask 60.

Figure 7:
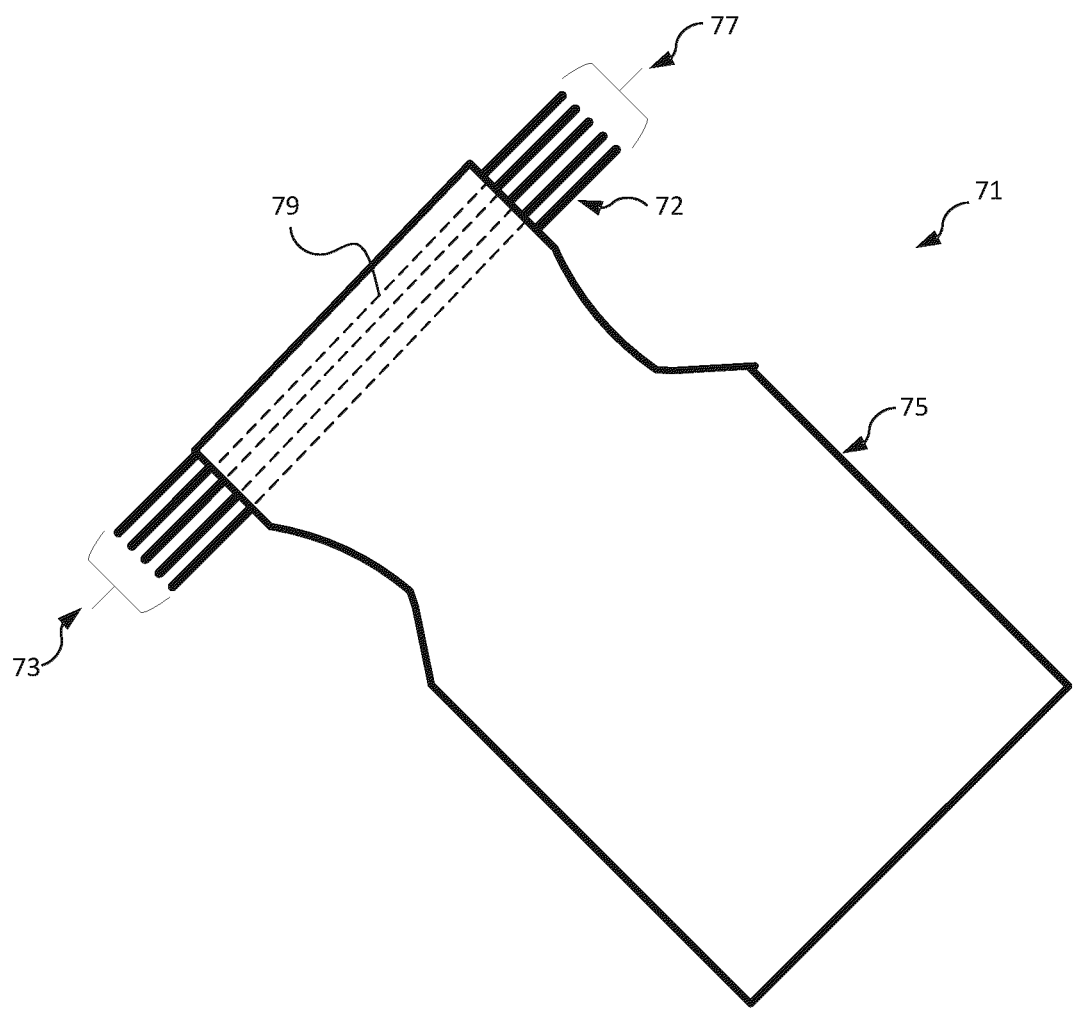
FIG. 7 is a top view of an exemplary grounding component, consistent with embodiments of the present disclosure.

FIG. 7 illustrates a top view of an exemplary grounding component 71, consistent with embodiments of the present disclosure. As shown in FIG. 7, grounding component 71 may comprise an extension 75. Extension 75 may protrude from a base (see, e.g., base 34 of FIG. 3 or base 44 of FIG. 4). Extension 75 may have different shapes (e.g., square, rectangular, round, etc.) and may comprise individual prongs 72, which may be conductive. Individual prongs 72 may contact a mask (see, e.g., mask 170 of FIG. 1, mask 30 of FIG. 3, mask 40 of FIG. 4, mask 50 of FIG. 5, or mask 60 of FIG. 6) at one or more positions to ensure that the mask is sufficiently grounded. Each individual prong 72 may be bent or set at different angles with respect to extension 75 (e.g., parallel to a surface of extension 75, perpendicular to a surface of extension 75, etc.) to ground various types of masks. Each individual prong 72 may be independent of another individual prong so that none of the individual prongs interfere with one another. In some embodiments, a first set of individual prongs 73 may be "offset" from a second set of individual prongs 77. That is, if a line 79 were drawn starting from one individual prong of first set 73 across extension 75, the line 79 would not contact an individual prong of second set 77. The offset nature of the prongs may help ensure that at least one prong contacts a conductive layer of a mask (e.g., conductive layer 56 of FIG. 5 or conductive layer 66 of FIG. 6).

Figure 8:
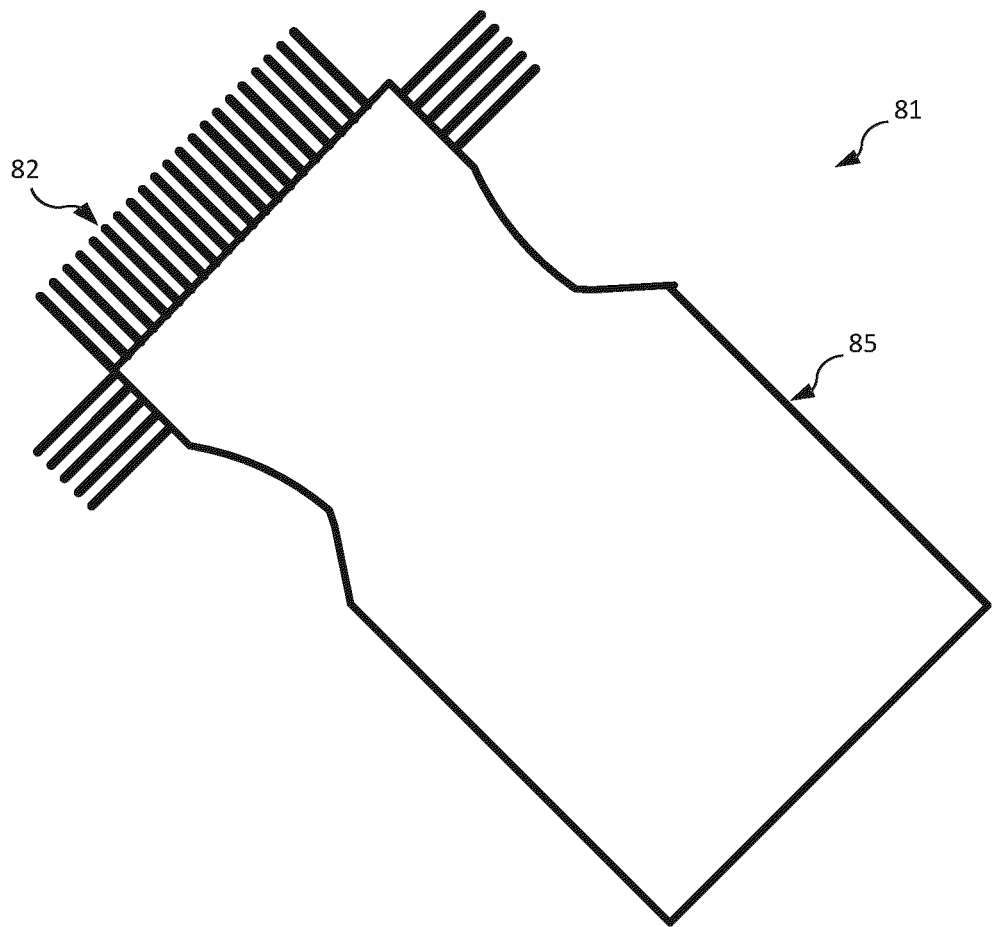
FIG. 8 is a top view of an exemplary grounding component, consistent with embodiments of the present disclosure.

FIG. 8 illustrates a top view of an exemplary grounding component 81, consistent with embodiments of the present disclosure. The components of FIG. 8 are similar to those of FIG. 7, except that FIG. 8 provides a grounding component 81 with a third set of individual prongs 82, which may be conductive.

As shown in FIG. 8, grounding component 81 may comprise an extension 85. Extension 85 may protrude from a base (see, e.g., base 34 of FIG. 3 or base 44 of FIG. 4). Extension 85 may comprise individual prongs 82 for grounding a mask (see, e.g., mask 170 of FIG. 1, mask 30 of FIG. 3, mask 40 of FIG. 4, mask 50 of FIG. 5, or mask 60 of FIG. 6).

Figure 9:
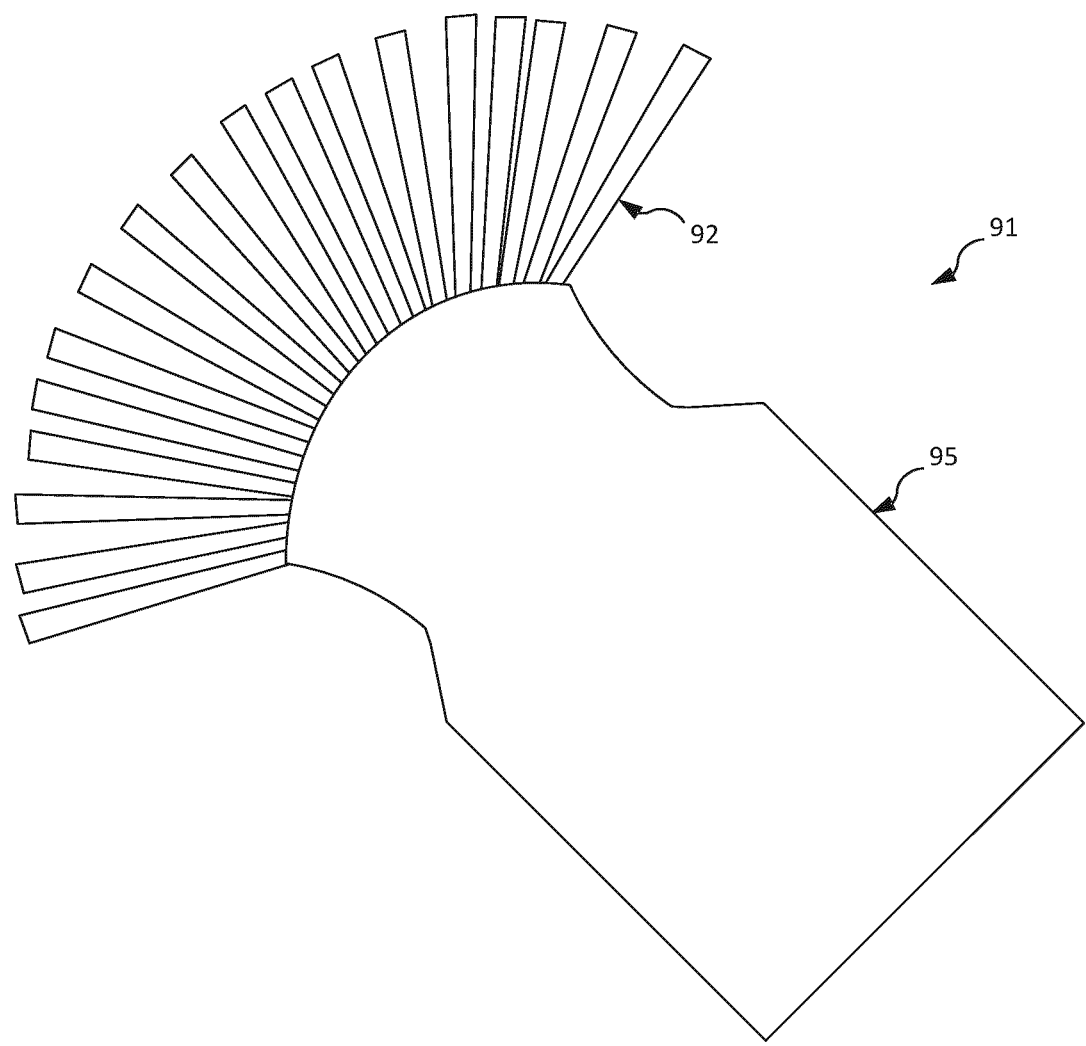
FIG. 9 is a top view of an exemplary grounding component, consistent with embodiments of the present disclosure.

FIG. 9 illustrates a top view of an exemplary grounding component 91, consistent with embodiments of the present disclosure. The components of FIG. 9 are similar to those of FIGS. 7 and 8, except that FIG. 9 provides a grounding component 91 with a different shape and a different prong pattern.

As shown in FIG. 9, grounding component 91 may comprise an extension 95. Extension 95 may protrude from a base (see, e.g., base 34 of FIG. 3 or base 44 of FIG. 4). Extension 95 may have a different shape (e.g., different from that of extension 75 of FIG. 7 or extension 85 of FIG. 8) and comprise a different arrangement of individual prongs 92 (e.g., different from that of individual prongs 72 of FIG. 7 or individual prongs 82 of FIG. 8), which may be conductive, for grounding a mask (see, e.g., mask 170 of FIG. 1, mask 30 of FIG. 3, mask 40 of FIG. 4, mask 50 of FIG. 5, or mask 60 of FIG. 6).

The embodiments may further be described using the following clauses:

1. A system for grounding extreme ultraviolet (EUV) masks, comprising:
    a grounding component comprising:
        a base; and
        an extension protruding from the base and comprising a conductive prong configured to contact a conductive layer of an EUV mask.
2. The system of clause 1, wherein the conductive prong comprises a plurality of conductive prongs.
3. The system of clause 2, wherein the plurality of conductive prongs comprises a first set of conductive prongs on a first side of the extension and a second set of conductive prongs on a second side of the extension.
4. The system of clause 3, wherein the first side is opposite of the second side.
5. The system of any one of clauses 3 and 4, wherein the first set of conductive prongs are offset from the second set of conductive prongs.
6. The system of any one of clauses 1-5, wherein the base comprises a first base and a second base.
7. The system of clause 6, wherein the first base extends in a direction perpendicular to a direction in which the second base extends.
8. The system of any one of clauses 1-7, wherein the grounding component is configured to receive an applied voltage.
9. The system of any one of clauses 1-8, wherein the conductive prong is configured to extend into a space within a non-conductive layer of an EUV mask.
10. The system of any one of clauses 1-9, further comprising an EUV mask having a conductive layer and a non-conductive layer on the conductive layer.
11. The system of clause 10, wherein the conductive layer comprises a protruding portion that is coplanar with the non-conductive layer.
12. The system of any one of clauses 10 and 11, wherein the conductive layer is exposed by a space within the non-conductive layer.
13. A system for grounding masks, comprising:
    a grounding component, comprising:
        a base; and
        an extension protruding from the base and comprising a conductive prong configured to contact a conductive layer of a mask.
14. The system of clause 13, wherein the conductive prong comprises a plurality of conductive prongs.
15. The system of clause 14, wherein the plurality of conductive prongs comprises a first set of conductive prongs on a first side of the extension and a second set of conductive prongs on a second side of the extension.

16. The system of clause 15, wherein the first side is opposite of the second side.
17. The system of any one of clauses 15 and 16, wherein the first set of conductive prongs are offset from the second set of conductive prongs.
18. The system of any one of clauses 13-17, wherein the base comprises a first base and a second base.
19. The system of clause 18, wherein the first base extends in a direction perpendicular to a direction in which the second base extends.
20. The system of any one of clauses 13-19, wherein the grounding component is configured to receive an applied voltage.
21. The system of clause 13-20, wherein the conductive prong is configured to extend into a space within a non-conductive layer of a mask.
22. The system of any one of clauses 13-21, further comprising a mask having a conductive layer and a non-conductive layer on the conductive layer.
23. The system of clause 22, wherein the conductive layer comprises a protruding portion that is coplanar with the non-conductive layer.
24. The system of any one of clauses 22 and 23, wherein the conductive layer is exposed by a space within the non-conductive layer.
25. A grounding component, comprising:
    a base; and
    an extension protruding from the base and comprising a conductive prong configured to contact a conductive layer of a mask.
26. The grounding component of clause 25, wherein the conductive prong comprises a plurality of conductive prongs.
27. The grounding component of clause 26, wherein the plurality of conductive prongs comprises a first set of conductive prongs on a first side of the extension and a second set of conductive prongs on a second side of the extension.
28. The grounding component of clause 27, wherein the first side is opposite of the second side.
29. The grounding component of any one of clauses 27 and 28, wherein the first set of conductive prongs are offset from the second set of conductive prongs.
30. The grounding component of any one of clauses 25-29, wherein the base comprises a first base and a second base.
31. The grounding component of clause 30, wherein the first base extends in a direction perpendicular to a direction in which the second base extends.
32. The grounding component of any one of clauses 25-31, wherein the grounding component is configured to receive an applied voltage.
33. The grounding component of any one of clauses 25-32, wherein the conductive prong is configured to extend into a space within a non-conductive layer of a mask.

A non-transitory computer readable medium may be provided that stores instructions for a processor of a controller (e.g., controller 109 of FIG. 1) for controlling mask inspection, consistent with embodiments in the present disclosure, based on the mask. For example, based on the mask, the controller may automatically adjust a length or a position (e.g., a corner of a mask, a side of a mask, etc.) of a grounding component handle with respect to the mask. Moreover, based on the mask, the controller may be configured to use a different grounding component to ground the mask. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:
1. A system for grounding extreme ultraviolet (EUV) masks, comprising:
   a grounding component comprising:
      a base; and
      an extension protruding from the base and comprising a conductive prong configured to contact a conductive layer of an EUV mask, the conductive layer exposed by a predefined space within a non-conductive layer of the EUV mask.
2. The system of claim 1, wherein the conductive prong comprises a plurality of conductive prongs.
3. The system of claim 2, wherein the plurality of conductive prongs comprises a first set of conductive prongs on a first side of the extension and a second set of conductive prongs on a second side of the extension.
4. The system of claim 3, wherein the first side is opposite of the second side.
5. The system of claim 3, wherein the first set of conductive prongs are offset from the second set of conductive prongs.
6. The system of claim 1, wherein the base comprises a first base and a second base.
7. The system of claim 6, wherein the first base extends in a direction perpendicular to a direction in which the second base extends.
8. The system of claim 1, wherein the grounding component is configured to receive an applied voltage.
9. The system of claim 1, wherein the conductive prong is configured to extend into the space within the non-conductive layer of the EUV mask.
10. The system of claim 1, wherein the non-conductive layer is on the conductive layer.
11. The system of claim 10, wherein the conductive layer comprises a protruding portion that is coplanar with the non-conductive layer.

12. A system for grounding masks, comprising:
- a grounding component, comprising:
  - a base; and
  - an extension protruding from the base and comprising a conductive prong configured to contact a conductive layer of a mask, the conductive layer exposed by a predefined space within a non-conductive layer of the mask.

13. The system of claim 12, wherein the conductive prong comprises a plurality of conductive prongs.

14. The system of claim 13, wherein the plurality of conductive prongs comprises a first set of conductive prongs on a first side of the extension and a second set of conductive prongs on a second side of the extension.

15. The system of claim 14, wherein the first side is opposite of the second side.

16. The system of claim 14, wherein the first set of conductive prongs are offset from the second set of conductive prongs.

17. The system of claim 12, wherein the base comprises a first base and a second base.

18. The system of claim 17, wherein the first base extends in a direction perpendicular to a direction in which the second base extends.

19. The system of claim 12, wherein the grounding component is configured to receive an applied voltage.

20. The system of claim 12, wherein the conductive prong is configured to extend into the space within the non-conductive layer of a mask.

21. The system of claim 12, wherein the non-conductive layer is on the conductive layer.

22. The system of claim 21, wherein the conductive layer comprises a protruding portion that is coplanar with the non-conductive layer.

* * * * *